(12) United States Patent
Chen et al.

(10) Patent No.: US 12,408,488 B2
(45) Date of Patent: Sep. 2, 2025

(54) MICRO LIGHT-EMITTING DIODE DEVICE

(71) Applicant: MIKRO MESA TECHNOLOGY CO., LTD., Apia (WS)

(72) Inventors: Li-Yi Chen, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 436 days.

(21) Appl. No.: 18/182,390

(22) Filed: Mar. 13, 2023

(65) Prior Publication Data

US 2024/0313154 A1 Sep. 19, 2024

(51) Int. Cl.
*H10H 29/14* (2025.01)
*H10H 20/81* (2025.01)
*H10H 20/825* (2025.01)
*H10H 20/833* (2025.01)
*H10H 20/852* (2025.01)
*H10H 20/855* (2025.01)

(52) U.S. Cl.
CPC ...... *H10H 20/8215* (2025.01); *H10H 20/825* (2025.01); *H10H 20/833* (2025.01); *H10H 20/852* (2025.01); *H10H 20/855* (2025.01); *H10H 29/142* (2025.01)

(58) Field of Classification Search
CPC .............. H10H 20/8215; H10H 20/825; H10H 20/833; H10H 20/852; H10H 20/855
See application file for complete search history.

(56) References Cited

U.S. PATENT DOCUMENTS

| 6,987,285 | B2 * | 1/2006 | Nagashima | H01S 5/227 257/85 |
| 2011/0073888 | A1 * | 3/2011 | Ueno | B82Y 20/00 438/46 |
| 2019/0140065 | A1 * | 5/2019 | Mishima | H01L 21/28575 |
| 2019/0312178 | A1 * | 10/2019 | Obata | H10H 20/0137 |
| 2024/0312962 | A1 * | 9/2024 | Chen | H01L 25/0753 |
| 2024/0313155 | A1 * | 9/2024 | Chen | H10H 20/825 |
| 2024/0313161 | A1 * | 9/2024 | Okuno | H10H 20/815 |
| 2024/0313175 | A1 * | 9/2024 | Chen | H10H 20/855 |
| 2024/0421259 | A1 * | 12/2024 | Okuno | H10H 20/8252 |

* cited by examiner

*Primary Examiner* — Eugene Lee
(74) *Attorney, Agent, or Firm* — CKC & Partners Co., LLC

(57) ABSTRACT

A micro light-emitting diode device includes a substrate, a micro light-emitting diode, and a cathode transparent electrode. The micro light-emitting diode is disposed on the substrate and includes a p-type III-nitride layer, a first n-type III-nitride layer above the p-type III-nitride layer, a second n-type III-nitride layer above the first n-type III-nitride layer, and an active layer between the p-type and first n-type III-nitride layers. The second n-type III-nitride layer contains aluminum and has top and bottom surfaces. A refractive index of the second n-type III-nitride layer is smaller than a refractive index of the first n-type III-nitride layer and varies in a monotonically non-decreasing manner from the top surface. The refractive index of the second n-type III-nitride layer is larger at the bottom surface than at the top surface. The cathode transparent electrode is in contact with the top surface.

27 Claims, 12 Drawing Sheets

MICRO LIGHT-EMITTING DIODE DEVICE

BACKGROUND

Field of Invention

The present disclosure relates to a micro light-emitting diode device.

Description of Related Art

The statements in this section merely provide background information related to the present disclosure and do not necessarily constitute prior art.

As a light source, light-emitting diodes (LEDs) have many advantages, including low energy consumption, long lifetime, small size, and fast switching. Hence, conventional lighting, such as incandescent lighting, is gradually replaced by LED lights. The properties regarding LEDs also fit applications on displays. Researches on displays using micro light-emitting devices, or specifically, micro light-emitting diodes (micro LEDs), have become popular in recent years. Commercial lighting applications made of micro LEDs are nearly within reach.

GaN (InGaN, AlGaN) based LEDs have become the majority of LED Illumination. Since the GaN based LED display gradually becomes mainstream in the display market, searching for better performance for the GaN based LED display becomes an important topic, and the display industries are starting to pay attention on it.

SUMMARY

According to some embodiments of the present disclosure, a micro light-emitting diode device includes a substrate, a micro light-emitting diode, and a cathode transparent electrode. The micro light-emitting diode has a lateral width smaller than 100 µm. The micro light-emitting diode is disposed on and in contact with the anode electrode. The micro light-emitting diode includes a p-type III-nitride layer, a first n-type III-nitride layer, a second n-type III-nitride layer, and an active layer. The first n-type III-nitride layer is above the p-type III-nitride layer. The second n-type III-nitride layer is above and in contact with the first n-type III-nitride layer. The second n-type III-nitride layer contains aluminum and has a top surface and a bottom surface respectively away from and adjacent to the first n-type III-nitride layer. A refractive index of the second n-type III-nitride layer is smaller than a refractive index of the first n-type III-nitride layer and varies in a monotonically non-decreasing manner from the top surface. The refractive index of the second n-type III-nitride layer is larger at the bottom surface than at the top surface. The active layer is between the p-type III-nitride layer and the first n-type III-nitride layer. The cathode transparent electrode is at least partially in contact with the top surface of the second n-type III-nitride layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
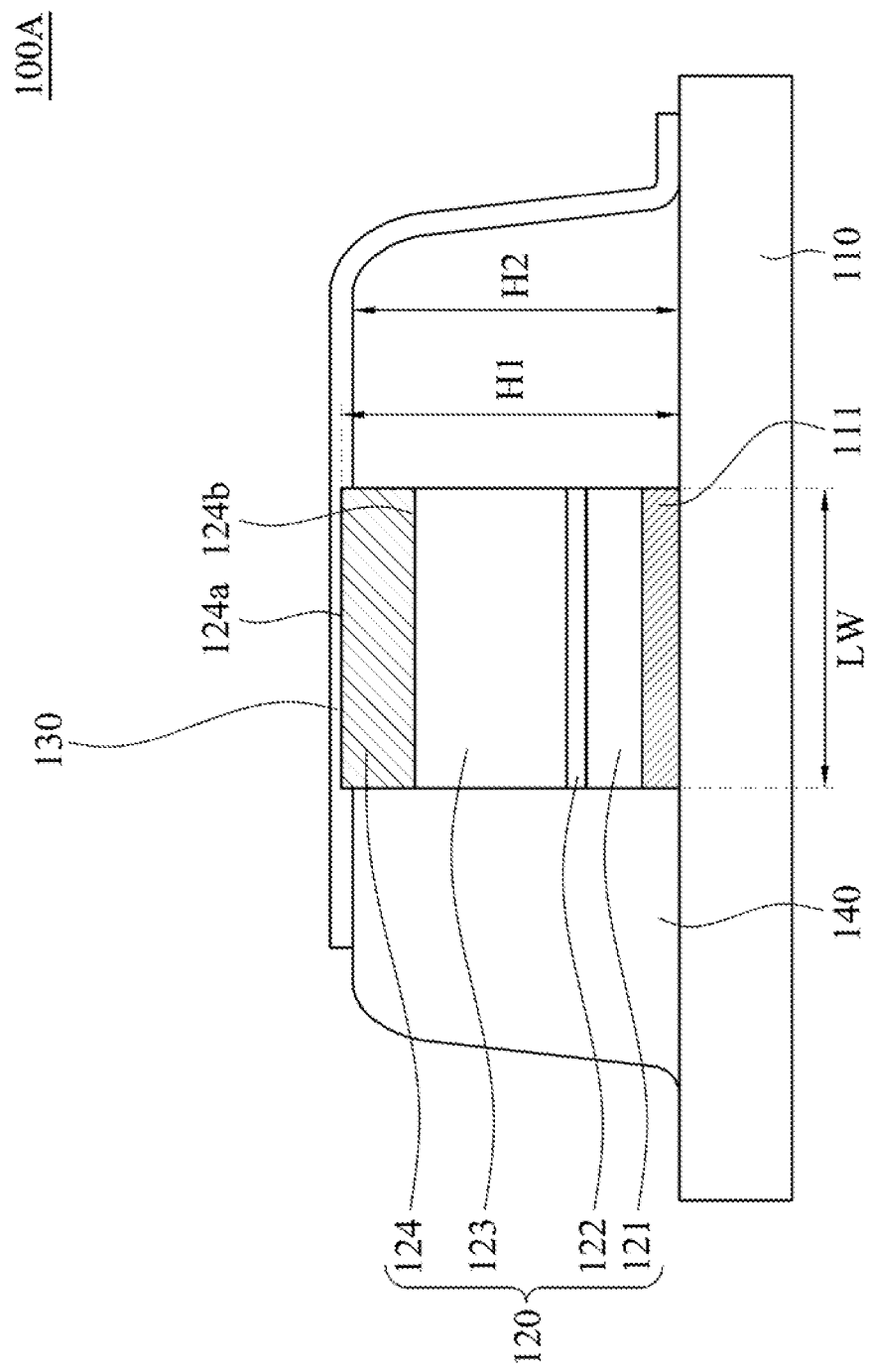
FIG. 1 is a schematic cross-sectional view of a micro light-emitting diode device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "micro" device, "micro" p-n diode or "micro" LED as used herein may refer to the descriptive size of certain devices or structures according to embodiments of the present disclosure. As used herein, the terms "micro" devices or structures may be meant to refer to the scale of 1 to 100 μm. However, it is to be appreciated that embodiments of the present disclosure are not necessarily so limited, and that certain aspects of the embodiments may be applicable to larger, and possibly smaller size scales. The refractive index mentioned in the following, unless otherwise specified, is based on the refractive index of light with a wavelength λ of 550 nm.

Reference is made to FIG. 1. FIG. 1 is a schematic cross-sectional view of a micro light-emitting diode device 100A according to some embodiments of the present disclosure. As shown in FIG. 1, in some embodiments, the micro light-emitting diode device 100A includes a substrate 110, a micro light-emitting diode 120, and a cathode transparent electrode 130. The micro light-emitting diode 120 has a lateral width LW smaller than 100 μm. For example, the lateral width LW is the width of micro light-emitting diode 120 shown in FIG. 1. The substrate 110 has an anode electrode 111 thereon. The micro light-emitting diode 120 is disposed on and in contact with the anode electrode 111. The micro light-emitting diode 120 includes a p-type III-nitride layer 121, a first n-type III-nitride layer 123, a second n-type III-nitride layer 124, and an active layer 122. The first n-type III-nitride layer 123 is above the p-type III-nitride layer 121. The second n-type III-nitride layer 124 is above and in contact with the first n-type III-nitride layer 123. The second n-type III-nitride layer 124 contains aluminum and has a top surface 124a and bottom surface 124b respectively away from and adjacent to the first n-type III-nitride layer 123. A refractive index of the second n-type III-nitride layer 124 is smaller than a refractive index of the first n-type III-nitride layer 123 and varies in a monotonically non-decreasing manner from the top surface 124a. The refractive index of the second n-type III-nitride layer 124 is larger at the bottom surface 124b than at the top surface 124a.

In some embodiments, the refractive index of the second n-type III-nitride layer 124 monotonically increases from the top surface 124a to the bottom surface 124b of the second n-type III-nitride layer 124. In other words, the refractive index of the second n-type III-nitride layer 124 varies in a way that only ever increases from the top surface 124a. That is, the refractive index of the second n-type III-nitride layer 124 has a minimum value at the top surface 124a and a maximum value at the bottom surface 124b, and the maximum value is still smaller than the refractive index of the first n-type III-nitride layer 123. "III" (group III) of each of the p-type III-nitride layer 121, the first n-type III-nitride layer 123, and the second n-type III-nitride layer 124 refers to (or consists of) at least one element of aluminum, gallium, and indium. The active layer 122 is between the p-type III-nitride layer 121 and the first n-type III-nitride layer 123. The cathode transparent electrode 130 at least partially covers and is in contact with the top surface 124a of the second n-type III-nitride layer 124.

It should be pointed out that since the second n-type III-nitride layer 124 contains aluminum relative to the first n-type III-nitride layer 123, the band gap of the second n-type III-nitride layer 124 is wider than the band gap of the first n-type III-nitride layer 123. In general, the wider band gap of the second n-type III-nitride layer 124 causes the refractive index thereof to be smaller than the refractive index of the first n-type III-nitride layer 123 with the narrower band gap.

By the way, the aluminum content in an III-nitride material has a positive influence to the band gap of the III-nitride material. The higher the atomic ratio of aluminum the material has, the wider the band gap of the material. Thus, in some embodiments, an atomic ratio of aluminum in the second n-type III-nitride layer 124 varies in a monotonically non-increasing manner from the top surface 124a. In this way, the second n-type III-nitride layer 124 having the refractive index varying in a monotonically non-decreasing manner from the top surface 124a can be obtained.

Figure 2A:
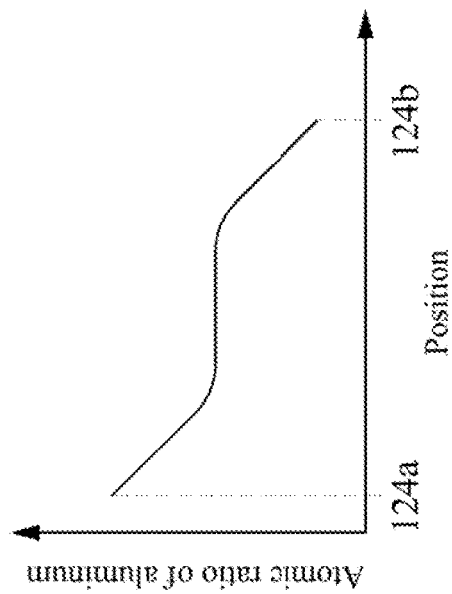
FIG. 2A is a graph showing distribution of an atomic ratio of aluminum in a second n-type III-nitride layer in a thickness direction according to some embodiments of the present disclosure.
Figure 2B:
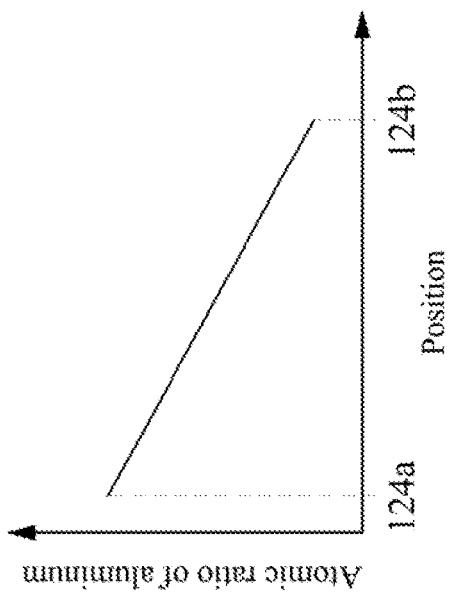
FIG. 2B is a graph showing the distribution of the atomic ratio of aluminum in the second n-type III-nitride layer in the thickness direction according to some embodiments of the present disclosure.
Figure 2C:
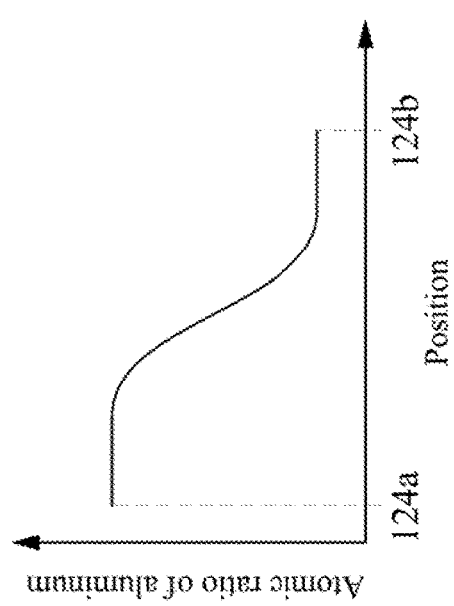
FIG. 2C is a graph showing the distribution of the atomic ratio of aluminum in the second n-type III-nitride layer in the thickness direction according to some embodiments of the present disclosure.

For example, reference is made to FIGS. 2A, 2B, and 2C. Each of FIGS. 2A to 2C is a graph showing distribution of the atomic ratio of aluminum in the second n-type III-nitride layer 124 in a thickness direction according to some embodiments of the present disclosure. The thickness direction may refer to a direction perpendicular to the top surface 124a or the bottom surface 124b. As shown in each of FIGS. 2A, 2B, and 2C, the atomic ratio of aluminum in the second n-type III-nitride layer 124 varies in a monotonically non-increasing manner from the top surface 124a.

Figure 3A:
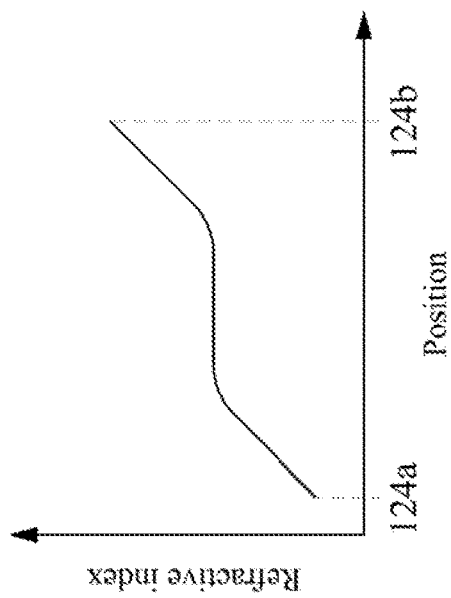
FIG. 3A is a graph showing distribution of a refractive index of the second n-type III-nitride layer of FIG. 2A in the thickness direction according to some embodiments of the present disclosure.
Figure 3B:
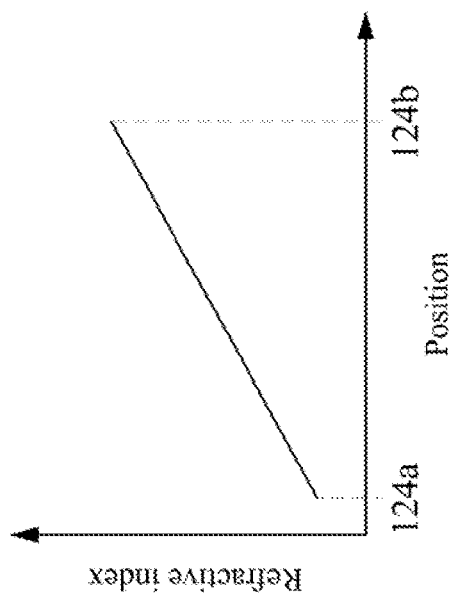
FIG. 3B is a graph showing distribution of the refractive index of the second n-type III-nitride layer of FIG. 2B in the thickness direction according to some embodiments of the present disclosure.
Figure 3C:
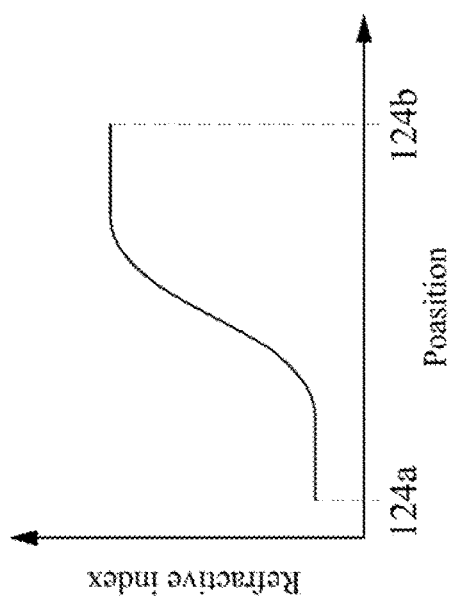
FIG. 3C is a graph showing distribution of the refractive index of the second n-type III-nitride layer of FIG. 2C in the thickness direction according to some embodiments of the present disclosure.

Reference is made to FIGS. 3A, 3B, and 3C. FIGS. 3A to 3C are graphs showing distributions of the refractive indices of the second n-type III-nitride layers 124 respectively of FIGS. 2A to 2C in the thickness direction according to some embodiments of the present disclosure. As shown in each of FIGS. 3A, 3B, and 3C, the refractive index of the second n-type III-nitride layer 124 varies in a monotonically non-decreasing manner from the top surface 124a.

Figure 2D:
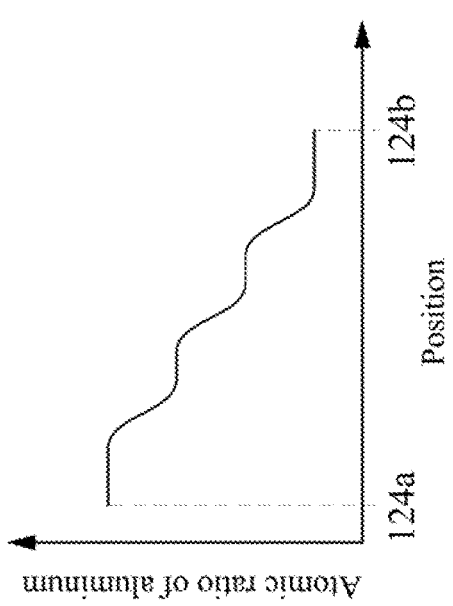
FIG. 2D is a graph showing the distribution of the atomic ratio of aluminum in the second n-type III-nitride layer in the thickness direction according to some embodiments of the present disclosure.

Reference is made to FIG. 2D. FIG. 2D is a graph showing the distribution of the atomic ratio of aluminum in the second n-type III-nitride layer 124 in the thickness direction according to some embodiments of the present disclosure. As shown in FIG. 2D, in some embodiments, the atomic ratio of aluminum in the second n-type III-nitride layer 124 monotonically decreases from the top surface 124a to the bottom surface 124b. In other words, the atomic ratio of aluminum in the second n-type III-nitride layer 124 varies in a way that only ever decreases from the top surface 124a. That is, the atomic ratio of aluminum of the second n-type III-nitride layer 124 has a minimum value at the bottom surface 124b and a maximum value at the top surface 124a.

Figure 3D:
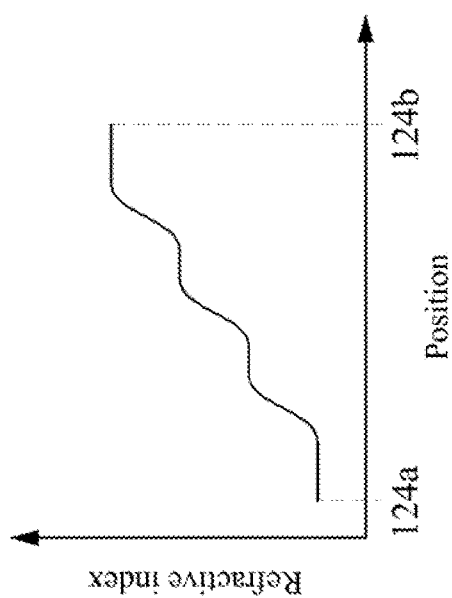
FIG. 3D is a graph showing distribution of the refractive index of the second n-type III-nitride layer of FIG. 2D in the thickness direction according to some embodiments of the present disclosure.

Reference is made to FIG. 3D. FIG. 3D is a graph showing distribution of the refractive index of the second n-type III-nitride layer 124 of FIG. 2D in the thickness direction according to some embodiments of the present disclosure As shown in FIG. 3D, the second n-type III-nitride layer 124 having the refractive index monotonically increases from the top surface 124a can be obtained.

In some embodiments, the second n-type III-nitride layer is formed by a deposition process, and the doping amount of aluminum can be dynamically adjusted during the deposition process.

In some embodiments, a refractive index of the cathode transparent electrode 130 is smaller than the refractive index of the second n-type III-nitride layer 124 at the top surface 124a. In other words, the refractive index of the second n-type III-nitride layer 124 is between the refractive index of the first n-type III-nitride layer 123 and the refractive index of the cathode transparent electrode 130.

According to Snell's Law, the phenomenon of refraction occurs when light propagates from one medium to another medium with a different refractive index. When the difference in refractive index between the two mediums is large, more light will be reflected at the interface between the two mediums. In detail, assuming that light travels from an optically dense medium (e.g., the first n-type III-nitride layer 123) with a refractive index of n1 to an optically sparser medium (e.g., the second n-type III-nitride layer 124) with a refractive index of n2 smaller than n1, and the incident angle θ1 is equal to the critical angle θc, the refracted ray will proceed along the tangent of the interface. The critical angle θc is the smallest angle of incidence at which total internal reflection occurs and can be determined by the following equation (1).

$$\theta c = \sin^{-1}(n2/n1) \quad (1)$$

Figure 4:
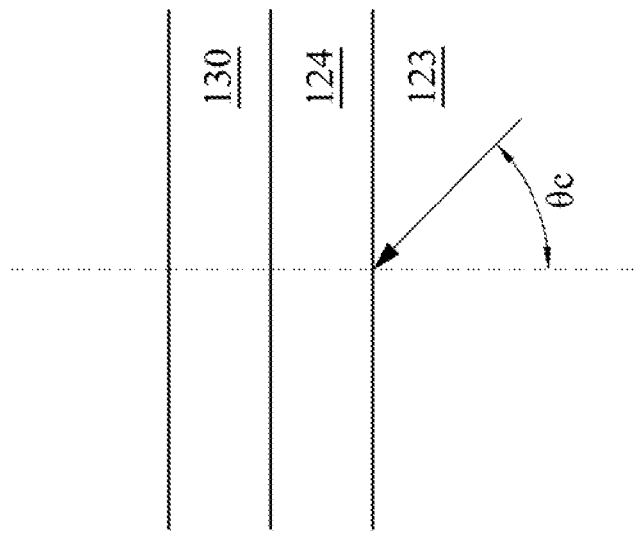
FIG. 4 is a schematic diagram showing two structures.
Figure 4:
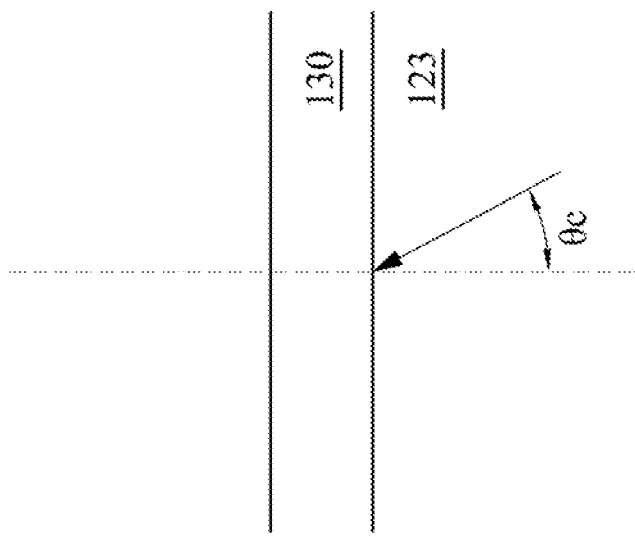

According to the above equation, it can be seen that the refractive index of n2 with a larger value can make the critical angle θc larger. That is, less light will be reflected at the interface between the two mediums. Reference is made to FIG. 4. FIG. 4 is a schematic diagram showing two structures, in which the left structure includes the first n-type III-nitride layer 123 and the cathode transparent electrode 130 stacked thereon, and the right structure includes the first n-type III-nitride layer 123, the second n-type III-nitride layer 124, and the cathode transparent electrode 130 sequentially stacked. Since the second n-type III-nitride layer 124 of the right structure in FIG. 4 has a larger refractive index than the cathode transparent electrode 130 of the left structure in FIG. 4, the right structure has a larger critical angle θc than the left structure. Therefore, compared with the left structure with only the first n-type III-nitride layer 123 and the cathode transparent electrode 130 stacked, the right structure with the first n-type III-nitride layer 123, the second n-type III-nitride layer 124, and the cathode transparent electrode 130 can have better light extraction efficiency.

In detail, the second n-type III-nitride layer 124 can be regarded as equivalent to a plurality of layers (for example, approaching infinite layers) stacked sequentially from the top surface 124a to the bottom surface 124b, and the refractive index of these layers increases sequentially from the top surface 124a to the bottom surface 124b. Since the difference in refractive index any adjacent two of the first n-type III-nitride layer 123, the layers of the second n-type III-nitride layer 124, and the cathode transparent electrode 130, less light will be reflected at the interfaces and thus the light extraction efficiency can be effectively improved.

In some embodiments, the refractive index of the first n-type III-nitride layer 123 may be 2.5. In some embodiments, the refractive index of the second n-type III-nitride layer 124 at the bottom surface 124b may be equal to or smaller than 2.5. For example, the refractive index of the second n-type III-nitride layer 124 may be in a range from 2.0 to 2.5. Since the difference in refractive index between the first n-type III-nitride layer 123 and the second n-type III-nitride layer 124 is appropriately small, more light propagating in the first n-type III-nitride layer 123 can enter the second n-type III-nitride layer 124 (i.e., less light is reflected at the interface between the first n-type III-nitride layer 123 and the second n-type III-nitride layer 124). In this way, the light extraction efficiency of the micro light-emitting diode 120 can be effectively improved.

In some embodiments, the thickness of the second n-type III-nitride layer 124 may be greater than 10 nm. In this way, the second n-type III-nitride layer 124 may have sufficient thickness to appear the effect of refractive index matching.

In some embodiments, the substrate 110 having the anode electrode 111 thereon is a substrate which is capable of driving the micro light-emitting diodes. For example, the substrate 110 has thin-film transistor circuits and thus makes the whole system as a display device.

In some embodiments, the thickness of the second n-type III-nitride layer 124 may be greater than 40 nm. In this way, the second n-type III-nitride layer 124 with the larger thickness can make the effect of refractive index matching appear more significantly. In addition, the flexibility of the processes of manufacturing the micro light-emitting diode 120 can be significantly increased.

In some embodiments, a sum of thicknesses of the p-type III-nitride layer 121, the active layer 122, the first n-type III-nitride layer 123, and the second n-type III-nitride layer 124 is greater than 400 nm. In this way, the micro light-emitting diode 120 can have sufficient strength to cope with subsequent transferring processes.

In some embodiments, a sum of the thicknesses of the first n-type III-nitride layer and the second n-type III-nitride layer is greater than a sum of the thicknesses of the active layer and the p-type III-nitride layer. In this way, the insulation distance between the cathode transparent electrode 130 and the anode electrode 111 can be increased to reduce the possibility of electrical short.

In some embodiments, the sum of the thicknesses of the first n-type III-nitride layer and the second n-type III-nitride layer is greater than 0.5 μm. It makes the isolation layer 140 easier to be thicker to avoid the electrical short.

In some embodiments, the cathode transparent electrode 130 is made of transparent conductive oxide. For example, the transparent conductive oxide may include ITO (Indium Tin Oxide), IZO (indium tin oxide), and AZO (aluminum zinc oxide), but the disclosure is not limited in this regard. The refractive index of the cathode transparent electrode 130 is not greater than the refractive index of the second n-type III-nitride layer 124 at the top surface 124a.

In some embodiments, the second n-type III-nitride layer 124 is an n-type $Al_xGa_{1-x}N$ layer. It should be pointed out that "Al" of the n-type $Al_xGa_{1-x}N$ layer refers to aluminum. "Ga" of the n-type $Al_xGa_{1-x}N$ layer refers to Gallium. "N" of the n-type $Al_xGa_{1-x}N$ layer refers to nitrogen. In some embodiments, the Al composition x is equal to or greater than 0.02 and smaller than 1.

In some embodiments, the anode electrode 111 contains metal. In some embodiments, the anode electrode 111 contains Ag—Al alloys, in which "Ag" refers to silver and "Al" refers to aluminum. The Ag—Al alloys may provide a good ohmic contact to the p-type III-nitride layer 121 and good light reflectivity. In some embodiments, the anode electrode 111 containing ITO, IZO, or nickel can also provide a good ohmic contact.

Figure 5:
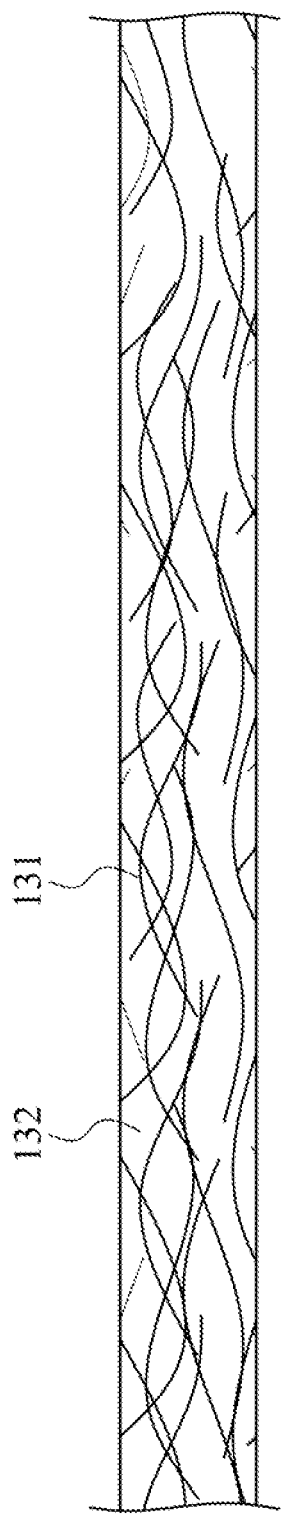
FIG. 5 is a partial schematic cross-sectional view of a cathode transparent electrode according to some embodiments of the present disclosure.

Reference is made to FIG. 5. FIG. 5 is a partial schematic cross-sectional view of a cathode transparent electrode 130 according to some embodiments of the present disclosure. As shown in FIG. 5, in some embodiments, the cathode transparent electrode 130 includes nano metal wires 131 and an encapsulation material 132 in which the nano metal wires 131 are embedded. The nano metal wires 131 are in contact with the second n-type III-nitride layer 124. The refractive index of the encapsulation material 132 can be regarded as the refractive index of the cathode transparent electrode 130. The refractive index of the encapsulation material 132 is smaller than the refractive index of the second n-type III-nitride layer 124 at the top surface 124a.

As shown in FIG. 1, in some embodiments, the micro light-emitting diode device 100A further includes an isolation layer 140. The isolation layer 140 is on the substrate 110 and surrounds the micro light-emitting diode 120. A height H2 of the isolation layer 140 relative to the substrate 110 is equal to or smaller than a height H1 of the top surface 124a of the second n-type III-nitride layer 124 relative to the substrate 110. In this way, the contact area between the micro light-emitting diode 120 and the cathode transparent electrode 130 is larger, so the resistance can be smaller. In addition, the upward light-emitting efficiency of the micro light-emitting diode device 100A can be better (because the isolation layer 140 does not cover the top surface 124a of the second n-type III-nitride layer 124).

In some embodiments, a refractive index of the isolation layer 140 is smaller than the refractive index of the cathode transparent electrode 130. That is, the difference in refractive index between the first n-type III-nitride layer 123 and the isolation layer 140 will be greater than the difference in refractive index between the first n-type III-nitride layer 123 and the second n-type III-nitride layer 124. In this way, more light will be reflected at the interface between the first n-type III-nitride layer 123 and the isolation layer 140 than the interface between the first n-type III-nitride layer 123 and the second n-type III-nitride layer 124, so that the upward light-emitting efficiency of the micro light-emitting diode device 100A can be further improved.

In some embodiments, the isolation layer 140 includes resin, but the disclosure is not limited in this regard.

Figure 6:
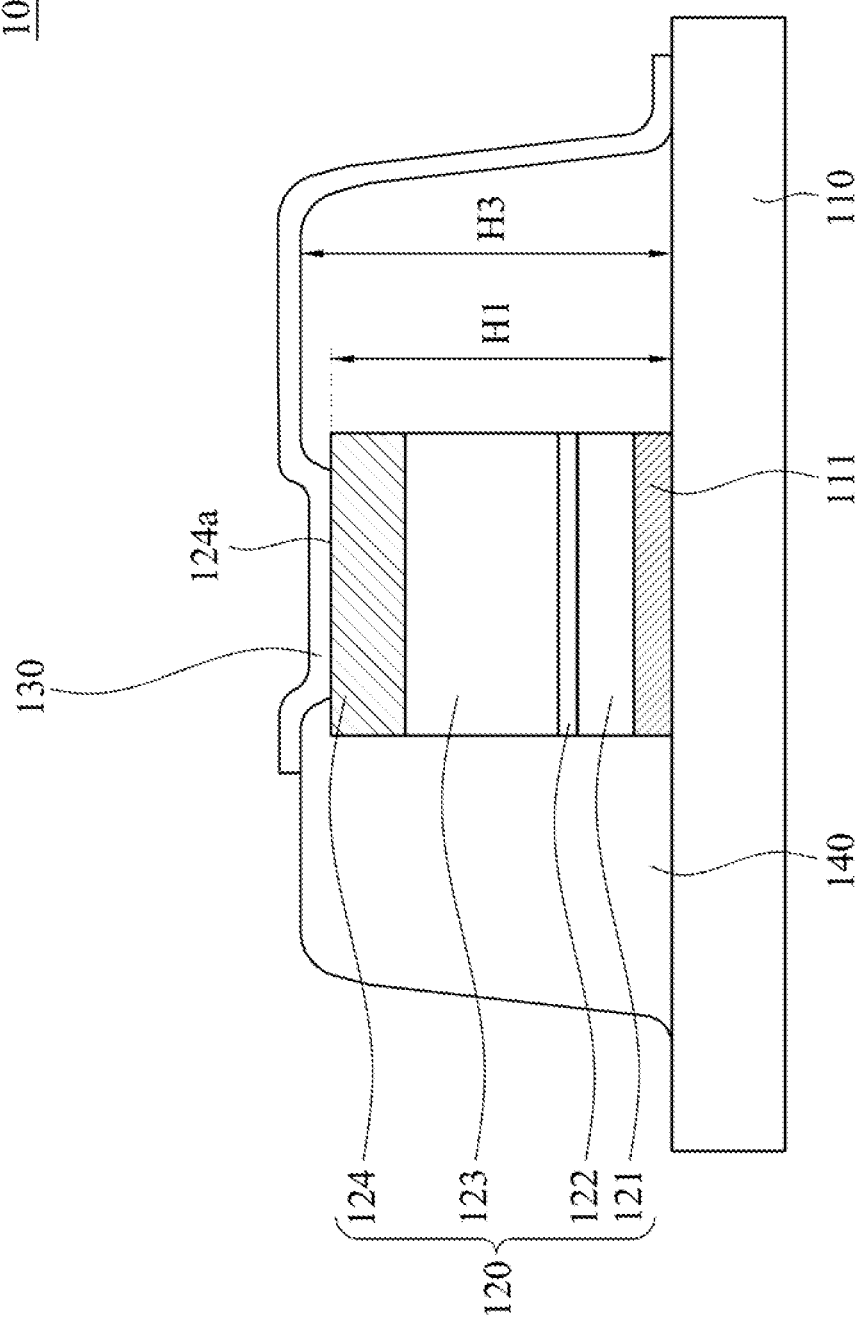
FIG. 6 is a schematic cross-sectional view of a micro light-emitting diode device according to some embodiments of the present disclosure.

Reference is made to FIG. 6. FIG. 6 is a schematic cross-sectional view of a micro light-emitting diode device 100B according to some embodiments of the present disclosure. As shown in FIG. 6, in some embodiments, the micro light-emitting diode device 100B includes a substrate 110, a micro light-emitting diode 120, a cathode transparent electrode 130, and an isolation layer 140. A difference between the embodiments shown in FIGS. 1 and 6 is that a height H3 of the isolation layer 140 as shown in FIG. 6 relative to the substrate 110 is greater than the height H1 of the top surface 124a of the second n-type III-nitride layer 124 relative to the substrate 110. In this way, the thickness of the isolation layer 140 shown in FIG. 6 is larger (compared to the isolation layer 140 shown in FIG. 1), which decreases the possibility of electrical short between the cathode transparent electrode 130 and the active layer 122. Thus, it may benefit the production yield rate of the micro light-emitting diode device 100B.

Figure 7A:
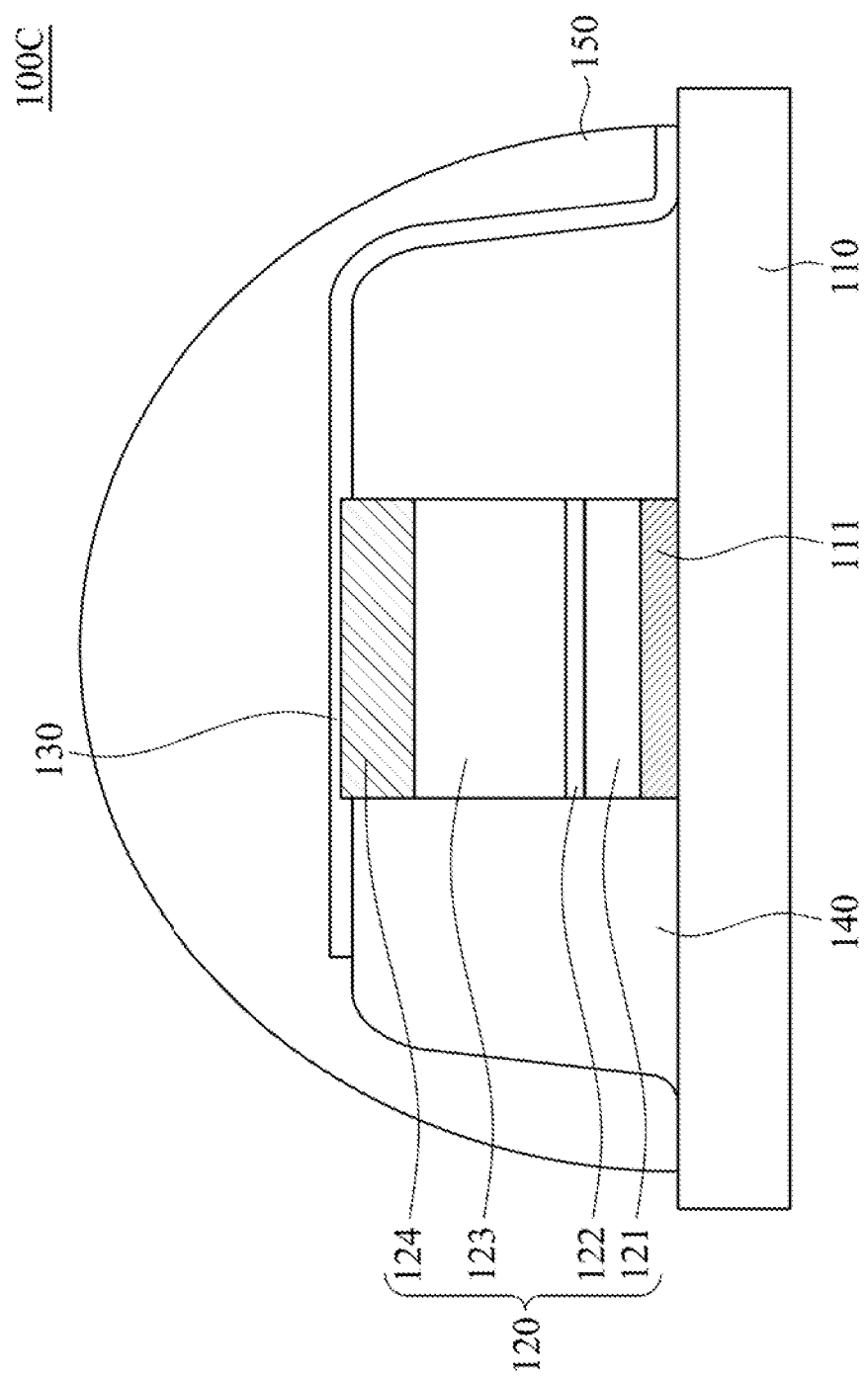
FIG. 7A is a schematic cross-sectional view of a micro light-emitting diode device according to some embodiments of the present disclosure.

Reference is made to FIG. 7A. FIG. 7A is a schematic cross-sectional view of a micro light-emitting diode device 100C according to some embodiments of the present disclosure. As shown in FIG. 7A, in some embodiments, the micro light-emitting diode device 100C includes a substrate 110, a micro light-emitting diode 120, a cathode transparent electrode 130, and an isolation layer 140. A difference between the embodiments shown in FIGS. 1 and 7A is that the micro light-emitting diode device 100C as shown in FIG. 7A further includes an encapsulation layer 150. The encapsulation layer 150 is above and in contact with the cathode transparent electrode 130. Specifically, the encapsulation layer 150 encapsulates the micro light-emitting diode 120, the cathode transparent electrode 130, and the isolation layer 140. A refractive index of the encapsulation layer 150 is smaller than the refractive index of the cathode transparent electrode 130. In this way, more light propagating in the first n-type III-nitride layer 123 can enter the encapsulation layer 150 sequentially via the second n-type III-nitride layer 124 and the cathode transparent electrode 130 with less reflection, such that the light extraction efficiency of the micro light-emitting diode 120 can be further improved.

In some embodiments where the refractive index of the second n-type III-nitride layer 124 is in a range from 2.0 to 2.5, the refractive index of the encapsulation layer 150 is smaller than 2.0.

Figure 7B:
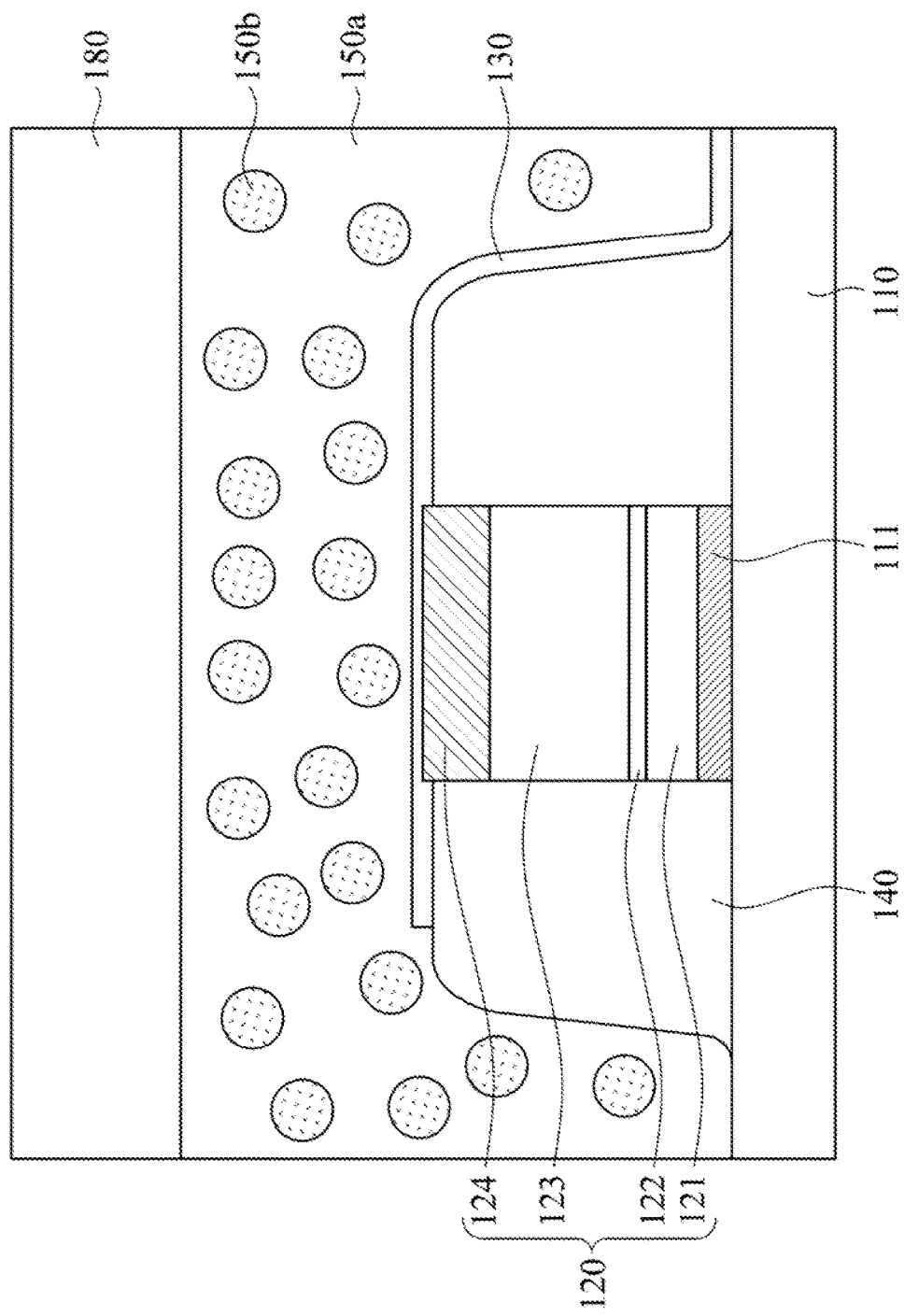
FIG. 7B is a schematic cross-sectional view of a micro light-emitting diode device according to some embodiments of the present disclosure.

Reference is made to FIG. 7B. FIG. 7B is a schematic cross-sectional view of a micro light-emitting diode device 100C-1 according to some embodiments of the present disclosure. As shown in FIG. 7B, in some embodiments, the micro light-emitting diode device 100C-1 includes a substrate 110, a micro light-emitting diode 120, a cathode transparent electrode 130, an isolation layer 140, and an encapsulation layer 150a. A difference between the embodiments shown in FIGS. 7A and 7B is that the encapsulation layer 150 as shown in FIG. 7A has a bulb shape, while the encapsulation layer 150a as shown in FIG. 7B has a layered shape. The encapsulation layer 150a is above and in contact with the cathode transparent electrode 130. Specifically, the encapsulation layer 150a encapsulates the micro light-emitting diode 120, the cathode transparent electrode 130, and the isolation layer 140. Another difference between the embodiments shown in FIGS. 7A and 7B is that the micro light-emitting diode device 100C-1 as shown in FIG. 7B further includes a covering film 180. The covering film 180 covers and is in contact with a surface of the encapsulation layer 150a away from the substrate 110. A refractive index of the encapsulation layer 150a is smaller than the refractive index of the cathode transparent electrode 130. In this way, more light propagating in the first n-type III-nitride layer 123 can enter the encapsulation layer 150a sequentially via the second n-type III-nitride layer 124 and the cathode transparent electrode 130 with less reflection, such that the light extraction efficiency of the micro light-emitting diode 120 can be further improved.

In some embodiments, as shown in FIG. 7B, the encapsulation layer 150a includes inorganic particles 150b evenly distributed therein. In this way, the refractive index of the encapsulation layer 150a can be adjusted by the inorganic particles 150b. In some embodiments, the inorganic particles 150b are $TiO_2$ particles, but the disclosure is not limited in this regard.

Figure 8:
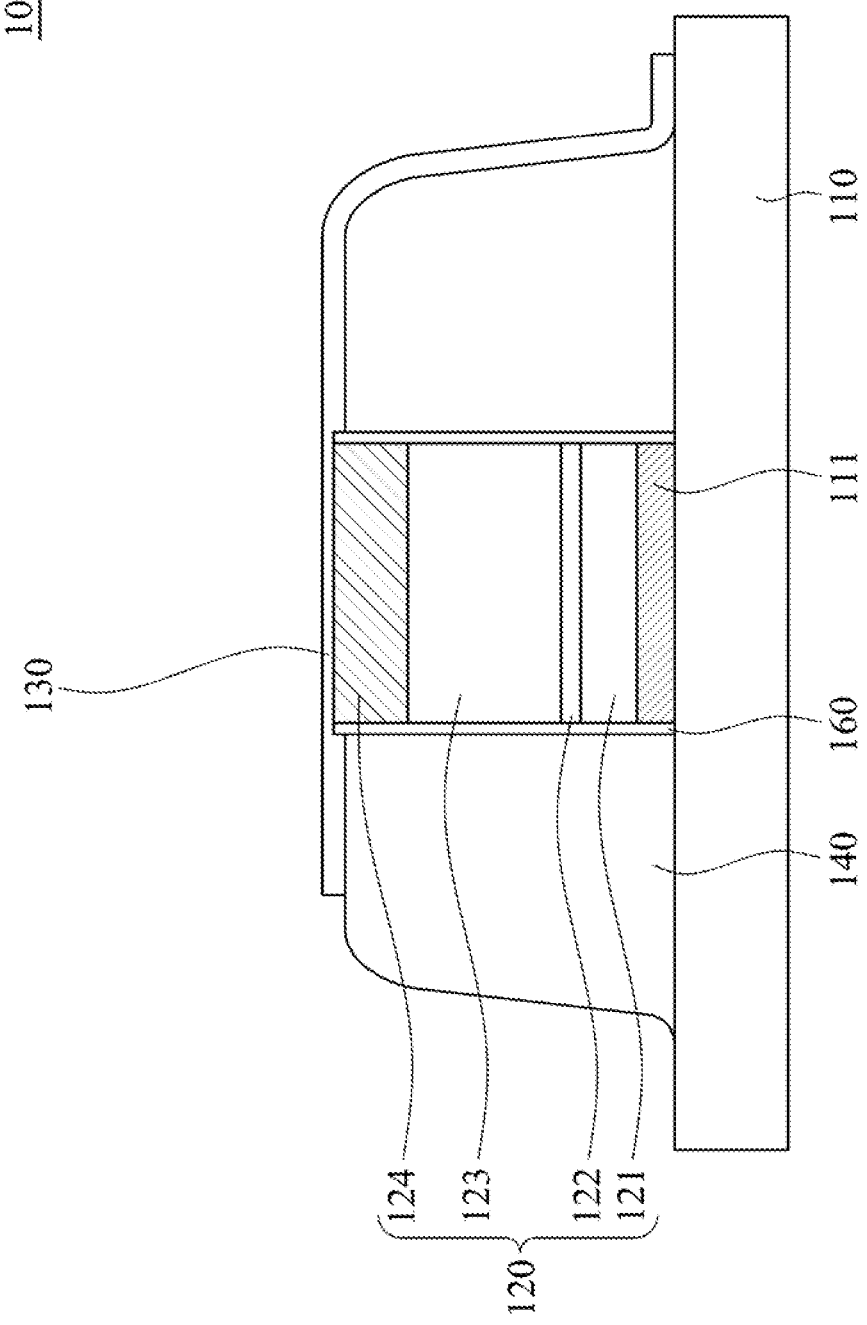
FIG. 8 is a schematic cross-sectional view of a micro light-emitting diode device according to some embodiments of the present disclosure.

Reference is made to FIG. 8. FIG. 8 is a schematic cross-sectional view of a micro light-emitting diode device 100D according to some embodiments of the present disclosure. As shown in FIG. 8, in some embodiments, the micro light-emitting diode device 100D includes a substrate 110, a micro light-emitting diode 120, a cathode transparent electrode 130, and an isolation layer 140. A difference between the embodiments shown in FIGS. 1 and 8 is that the micro light-emitting diode device 100D as shown in FIG. 8 further includes a dielectric layer 160. The dielectric layer 160 is between the isolation layer 140 and a side surface of the micro light-emitting diode 120. The dielectric layer 16 can reduce surface recombination on the side surface of the micro light-emitting diode 120 and thus it may improve the radiative recombination rate of the micro light-emitting diode 120.

Figure 9:
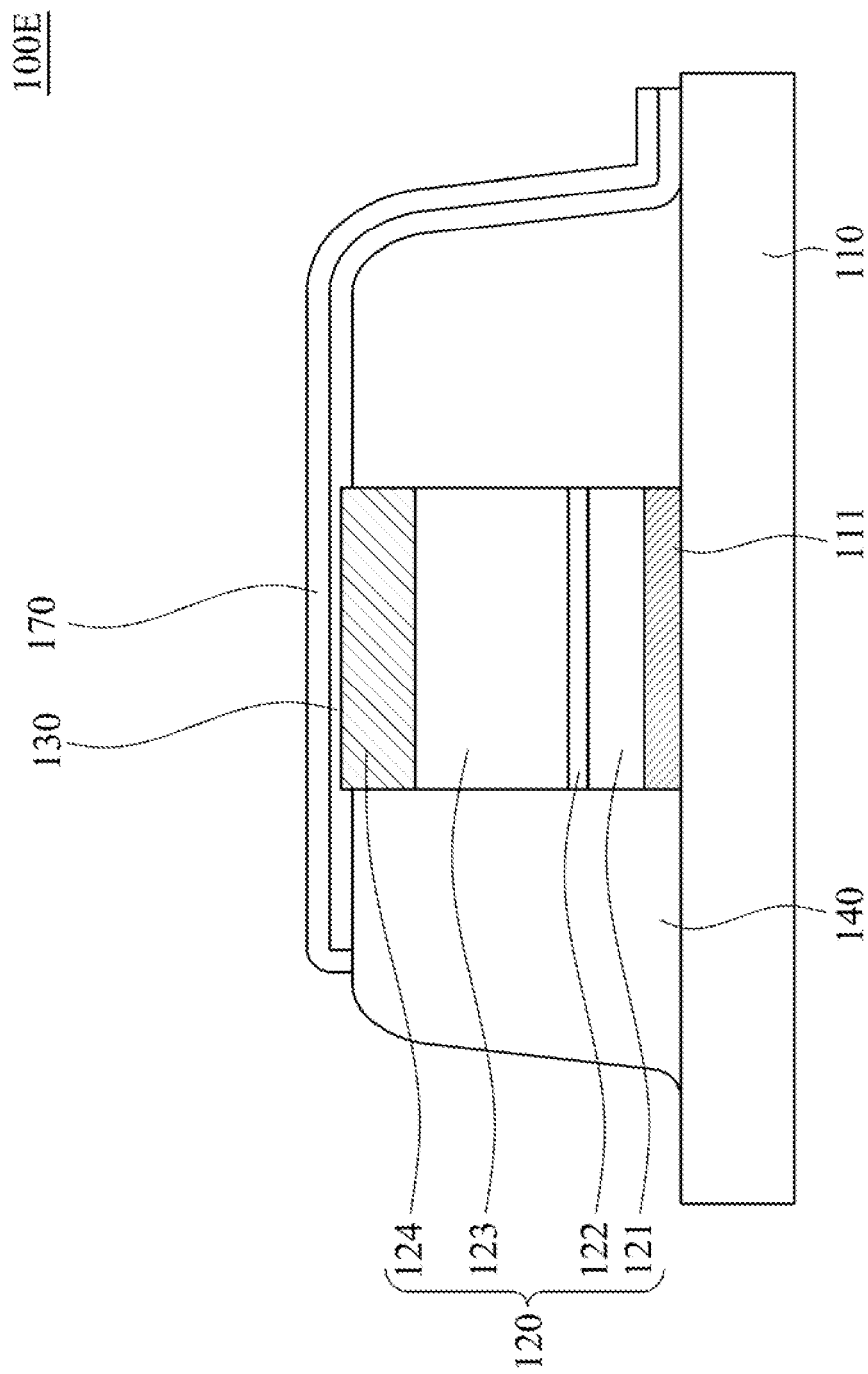
FIG. 9 is a schematic cross-sectional view of a micro light-emitting diode device according to some embodiments of the present disclosure.

Reference is made to FIG. 9. FIG. 9 is a schematic cross-sectional view of a micro light-emitting diode device 100E according to some embodiments of the present disclosure. As shown in FIG. 9, in some embodiments, the micro light-emitting diode device 100E includes a substrate 110, a micro light-emitting diode 120, a cathode transparent electrode 130, and an isolation layer 140. A difference between the embodiments shown in FIGS. 1 and 9 is that the micro light-emitting diode device 100E further includes an MgO layer 170. The MgO layer 170 covers and is in contact with the cathode transparent electrode 130. A refractive index of the MgO layer 170 is smaller than the refractive index of the cathode transparent electrode 130. In this way, more light propagating in the first n-type III-nitride layer 123 can enter the MgO layer 170 sequentially via the second n-type III-nitride layer 124 and the cathode transparent electrode 130 with less reflection, such that the light extraction efficiency of the micro light-emitting diode 120 can be further improved.

Figure 10:
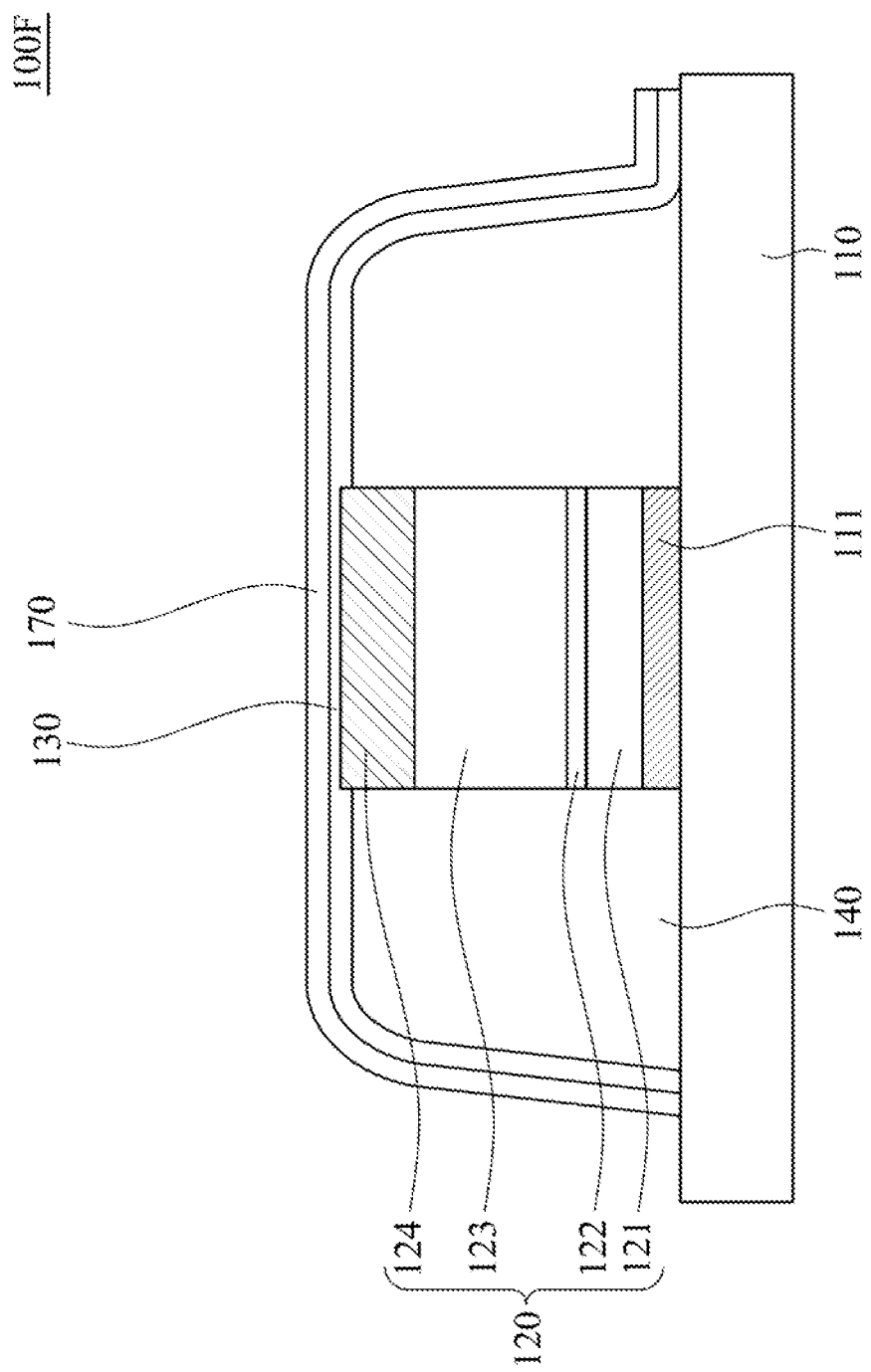
FIG. 10 is a schematic cross-sectional view of a micro light-emitting diode device according to some embodiments of the present disclosure.

Reference is made to FIG. 10. FIG. 10 is a schematic cross-sectional view of a micro light-emitting diode device 100F according to some embodiments of the present disclosure. As shown in FIG. 10, in some embodiments, the micro light-emitting diode device 100F includes a substrate 110, a micro light-emitting diode 120, a cathode transparent electrode 130, an isolation layer 140, and an MgO layer 170. A difference between the embodiments shown in FIGS. 9 and 10 is that the cathode transparent electrode 130 and the MgO layer 170 of the micro light-emitting diode device 100F have larger coverage areas. In this way, the light output distribution of the micro light-emitting diode device 100F can be more symmetric.

Figure 11:
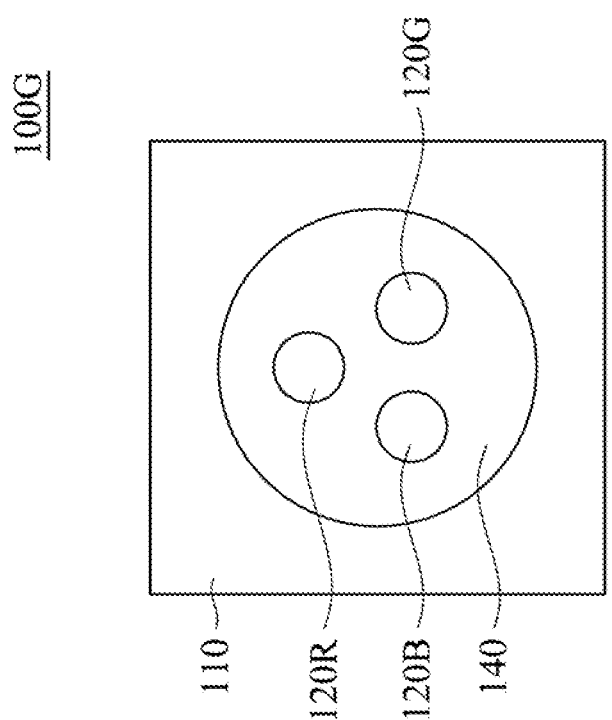
FIG. 11 is a schematic top view of a micro light-emitting diode device according to some embodiments of the present disclosure.

Reference is made to FIG. 11. FIG. 11 is a schematic top view of a micro light-emitting diode device 100G according to some embodiments of the present disclosure. As shown in FIG. 11, the micro light-emitting diode device 100G includes a substrate 110, a plurality of micro light-emitting diodes 120R, 120G, 120B, and an isolation layer 140. The micro light-emitting diodes 120R, 120G, 120B are disposed on the substrate 110. Each of the micro light-emitting diodes 120R, 120G, 120B has a structure similar to that of the micro light-emitting diode 120 shown in FIG. 1 and has a lateral width smaller than 100 μm. The isolation layer 140 is disposed on the substrate 110 and surrounds the micro light-emitting diodes 120R, 120G, 120B. The micro light-emitting diodes 120R, 120G, 120B are configured to emit lights of different wavelengths respectively. For example, the micro light-emitting diodes 120R, 120G, 120B are configured to emit a red light, a green light, and a blue light. Since the micro light-emitting diodes 120R, 120G, 120B are surrounded by the same isolation layer 140, lights emitted by the micro light-emitting diodes 120R, 120G, 120B can be evenly mixed.

In some embodiments, a distance between any two of the micro light-emitting diodes 120R, 120G, 120B is less than 500 μm. In this way, lights emitted by the micro light-emitting diodes 120R, 120G, 120B can be mixed more evenly.

Figure 12:
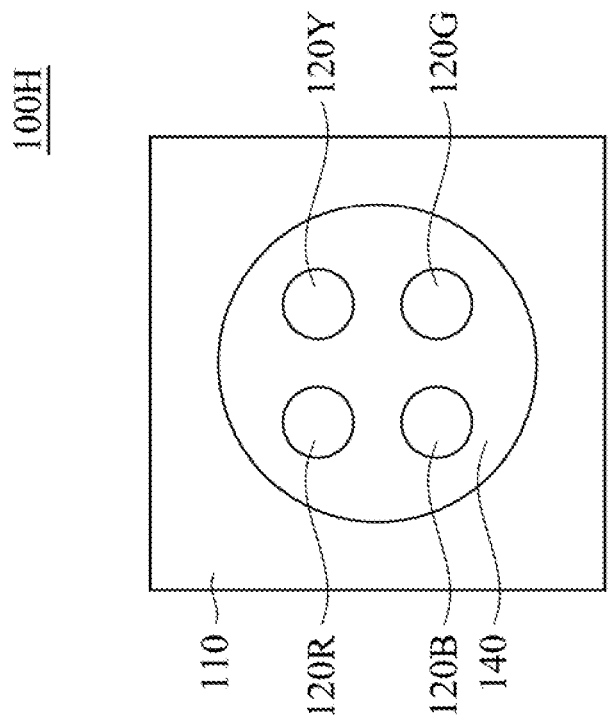
FIG. 12 is a schematic top view of a micro light-emitting diode device according to some embodiments of the present disclosure.

Reference is made to FIG. 12. FIG. 12 is a schematic top view of a micro light-emitting diode device 100H according to some embodiments of the present disclosure. Compared to the micro light-emitting diode device 100G shown in FIG. 11, the micro light-emitting diode device 100H further includes a micro light-emitting diode 120Y. The micro light-emitting diode 120Y is also surrounded by the isolation layer 140, and is configured to emit a yellow light. Since the micro light-emitting diodes 120R, 120G, 120B, 120Y are surrounded by the same isolation layer 140, lights emitted by the micro light-emitting diodes 120R, 120G, 120B, 120Y can be evenly mixed. In some embodiments, a distance of any two of the micro light-emitting diodes 120R, 120G, 120B, 120Y is less than 2 mm. In this way, lights emitted by the micro light-emitting diodes 120R, 120G, 120B, 120Y can be mixed more evenly.

According to the foregoing recitations of the embodiments of the disclosure, it can be seen that in the micro light-emitting diode device of the disclosure, the micro light-emitting diode includes the second n-type III-nitride layer that contains aluminum relative to the first n-type III-nitride layer, so the refractive index of the second n-type III-nitride layer with the wider band gap will be smaller than the refractive index of the first n-type III-nitride layer with the narrower band gap, which can effectively improve the light extraction efficiency of the micro light-emitting diode. In addition, since the second n-type III-nitride layer has a refractive index varying in a monotonically non-decreasing manner from the top surface thereof, the light extraction efficiency can be further improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A micro light-emitting diode device, comprising:
   a substrate having an anode electrode thereon;
   a micro light-emitting diode having a lateral width smaller than 100 μm, disposed on and in contact with the anode electrode, and comprising:
      a p-type III-nitride layer;
      a first n-type III-nitride layer above the p-type III-nitride layer;
      a second n-type III-nitride layer above and in contact with the first n-type III-nitride layer, wherein the second n-type III-nitride layer contains aluminum and has a top surface and a bottom surface respectively away from and adjacent to the first n-type III-nitride layer, a refractive index of the second n-type III-nitride layer is smaller than a refractive index of the first n-type III-nitride layer and varies in a monotonically non-decreasing manner from the top surface, and the refractive index of the second n-type III-nitride layer is larger at the bottom surface than at the top surface; and
an active layer between the p-type III-nitride layer and the first n-type III-nitride layer; and
a cathode transparent electrode at least partially in contact with the top surface of the second n-type III-nitride layer.

2. The micro light-emitting diode device of claim 1, wherein the refractive index of the second n-type III-nitride layer monotonically increase from the top surface.

3. The micro light-emitting diode device of claim 1, further comprising:
an isolation layer on the substrate and surrounding the micro light-emitting diode, wherein a height of the isolation layer relative to the substrate is equal to or smaller than a height of the top surface of the second n-type III-nitride layer relative to the substrate.

4. The micro light-emitting diode device of claim 3, wherein a refractive index of the isolation layer is smaller than a refractive index of the cathode transparent electrode.

5. The micro light-emitting diode device of claim 3, further comprising:
a dielectric layer between the isolation layer and a side surface of the micro light-emitting diode.

6. The micro light-emitting diode device of claim 1, wherein the cathode transparent electrode is made of transparent conductive oxide, and a refractive index of the cathode transparent electrode is smaller than the refractive index of the second n-type III-nitride layer.

7. The micro light-emitting diode device of claim 1, further comprising an encapsulation layer above and in contact with the cathode transparent electrode, wherein the cathode transparent electrode comprises nano metal wires in contact with the second n-type III-nitride layer.

8. The micro light-emitting diode device of claim 1, further comprising:
an encapsulation layer above and in contact with the cathode transparent electrode, wherein a refractive index of the encapsulation layer is smaller than a refractive index of the cathode transparent electrode.

9. The micro light-emitting diode device of claim 8, wherein the refractive index of the encapsulation layer is smaller than 2.0.

10. The micro light-emitting diode device of claim 8, further comprising:
an isolation layer on the substrate and surrounding the micro light-emitting diode, wherein the refractive index of the encapsulation layer is greater than a refractive index of the isolation layer.

11. The micro light-emitting diode device of claim 1, further comprising:
an MgO layer covering and in contact with the cathode transparent electrode, wherein a refractive index of the MgO layer is smaller than a refractive index of the cathode transparent electrode.

12. The micro light-emitting diode device of claim 1, further comprising:
an isolation layer on the substrate and surrounding the micro light-emitting diode, wherein a height of the isolation layer relative to the substrate is greater than a height of the top surface of the second n-type III-nitride layer relative to the substrate.

13. The micro light-emitting diode device of claim 12, wherein a refractive index of the isolation layer is smaller than the refractive index of the cathode transparent electrode.

14. The micro light-emitting diode device of claim 12, further comprising:
a dielectric layer between the isolation layer and a side surface of the micro light-emitting diode.

15. The micro light-emitting diode device of claim 1, wherein the refractive index of the second n-type III-nitride layer is equal to or smaller than 2.5.

16. The micro light-emitting diode device of claim 1, wherein an atomic ratio of aluminum in the second n-type III-nitride layer varies in a monotonically non-increasing manner from the top surface.

17. The micro light-emitting diode device of claim 16, wherein the atomic ratio of aluminum in the second n-type III-nitride layer monotonically decreases from the top surface.

18. The micro light-emitting diode device of claim 1, wherein the second n-type III-nitride layer is an n-type $Al_xGa_{1-x}N$ layer.

19. The micro light-emitting diode device of claim 1, wherein a thickness of the second n-type III-nitride layer is greater than 40 nm.

20. The micro light-emitting diode device of claim 1, wherein the anode electrode contains metal.

21. The micro light-emitting diode device of claim 20, wherein the anode electrode contains Ag—Al alloys.

22. The micro light-emitting diode device of claim 20, wherein the anode electrode contains nickel.

23. The micro light-emitting diode device of claim 1, wherein a sum of thicknesses of the p-type III-nitride layer, the active layer, the first n-type III-nitride layer, and the second n-type III-nitride layer is greater than 400 nm.

24. The micro light-emitting diode device of claim 1, wherein a sum of thicknesses of the first n-type III-nitride layer and the second n-type III-nitride layer is greater than a sum of thicknesses of the active layer and the p-type III-nitride layer.

25. The micro light-emitting diode device of claim 1, wherein a sum of thicknesses of the first n-type III-nitride layer and the second n-type III-nitride layer is greater than 0.5 μm.

26. The micro light-emitting diode device of claim 1, further comprising:
another micro light-emitting diode disposed on the substrate, wherein the micro light-emitting diode and the another micro light-emitting diode are configured to emit lights of different wavelengths respectively; and
an isolation layer disposed on the substrate and surrounding the micro light-emitting diode and the another micro light-emitting diode.

27. The micro light-emitting diode device of claim 26, wherein a distance between the micro light-emitting diode and the another micro light-emitting diode is less than 500 μm.

* * * * *